(12) United States Patent
Chen et al.

(10) Patent No.: US 10,404,251 B2
(45) Date of Patent: Sep. 3, 2019

(54) POWER DEVICE WITH INTEGRATED GATE DRIVER

(71) Applicant: The Hong Kong University of Science and Technology, Kowloon, Hong Kong (CN)

(72) Inventors: Jing Chen, Hong Kong (CN); Gaofei Tang, Hong Kong (CN)

(73) Assignee: THE HONG KONG UNIVERSITY OF SCIENCE AND TECHNOLOGY, Kowloon (HK)

( * ) Notice: Subject to any disclaimer, the term of this patent is extended or adjusted under 35 U.S.C. 154(b) by 0 days.

(21) Appl. No.: 16/097,808

(22) PCT Filed: May 3, 2017

(86) PCT No.: PCT/CN2017/082833
§ 371 (c)(1),
(2) Date: Oct. 30, 2018

(87) PCT Pub. No.: WO2017/190652
PCT Pub. Date: Nov. 9, 2017

(65) Prior Publication Data
US 2019/0140637 A1    May 9, 2019

Related U.S. Application Data

(60) Provisional application No. 62/391,554, filed on May 4, 2016.

(51) Int. Cl.
*H03K 17/687* (2006.01)
*H03K 17/0412* (2006.01)
(Continued)

(52) U.S. Cl.
CPC ............ *H03K 17/687* (2013.01); *H02M 1/08* (2013.01); *H03K 17/04123* (2013.01); *H03K 17/063* (2013.01); *H03K 2217/0081* (2013.01)

(58) Field of Classification Search
CPC ........... H03K 17/687; H03K 17/04123; H03K 17/063; H03K 2217/0081; H02M 1/08
(Continued)

(56) References Cited

U.S. PATENT DOCUMENTS

| 4,161,040 A | * | 7/1979 | Satoh | ...................... G11C 11/34 |
| | | | | 326/62 |
| 6,075,391 A | * | 6/2000 | Tarantola | .............. H03K 17/063 |
| | | | | 327/111 |

(Continued)

FOREIGN PATENT DOCUMENTS

| CN | 101771345 A | 7/2010 |
| CN | 101977046 A | 2/2011 |
| CN | 103532353 A | 1/2014 |

OTHER PUBLICATIONS

J. Delaine, P. Jeannin, D. Frey, and K. Guepratte, "High frequency DC-DC converter using GaN device," in Proc. Annu. IEEE Appl. Power Electron. Conf. Expo., Feb. 2012, 8 pages.
(Continued)

*Primary Examiner* — Tomi Skibinski
(74) *Attorney, Agent, or Firm* — Amin, Turocy & Watson, LLP

(57) ABSTRACT

The technology described herein is generally directed towards a self-bootstrap integrated gate driver circuit with high driving speed, enhanced driving capability and rail-to-rail output. A capacitor and diode are used with a first inverter coupled to a control signal input terminal, a second inverter coupled to the first inverter, a push-pull circuit comprising a pull-up transistor and a pull-down transistor and a power device comprising a power device transistor with a gate. Control signal input at one state controls the first inverter to a first output state, turns on the pull-down transistor to discharge the gate of the power device transistor, turns off the power device and charges the capacitor
(Continued)

through the diode. The control signal input in another state controls the first inverter to a second output state, turns off the pull-down transistor and turns on the pull-up transistor via the capacitor to turn on the power device.

20 Claims, 13 Drawing Sheets

(51) Int. Cl.
  *H02M 1/08* (2006.01)
  *H03K 17/06* (2006.01)
(58) Field of Classification Search
  USPC ....... 327/108–112, 427, 434, 437, 390, 333;
  326/82, 83, 87
  See application file for complete search history.

(56) References Cited

U.S. PATENT DOCUMENTS

| | | | |
|---|---|---|---|
| 6,856,177 B1* | 2/2005 | de Frutos | H03K 17/063 327/108 |
| 8,054,123 B2* | 11/2011 | Ha | H03K 19/018528 326/62 |
| 8,558,587 B2 | 10/2013 | Machida et al. | |
| 8,587,362 B2 | 11/2013 | Machida et al. | |
| 2002/0140501 A1 | 10/2002 | Goyhenetche et al. | |
| 2009/0231015 A1* | 9/2009 | Tobita | H03K 3/356113 327/333 |
| 2010/0283061 A1 | 11/2010 | Kelley | |
| 2011/0025397 A1 | 2/2011 | Wang et al. | |
| 2012/0075890 A1 | 3/2012 | Ozawa | |
| 2013/0241601 A1* | 9/2013 | Chen | H03K 17/063 327/108 |
| 2015/0171833 A1 | 6/2015 | Pi et al. | |
| 2016/0013730 A1 | 1/2016 | Neri | |
| 2016/0043072 A1* | 2/2016 | Vielemeyer | H01L 27/0629 327/109 |
| 2016/0087623 A1 | 3/2016 | Yamaguchi et al. | |

OTHER PUBLICATIONS

D. Reusch, and J. Strydom, "Understanding the effect of PCB layout on circuit performance in a high-frequency Gallium-nitride-based point of load converter," IEEE Transactions on Power Electronics, vol. 29, No. 4, Apr. 2014, 8 pages.
H. Wang, A. M. H. Kwan, Q. Jiang, and K. J. Chen, "A GaN Pulse Width Modulation Integrated Circuit," in Proc. IEEE Int. Symp. Power Semiconductor Devices & ICs, Hawaii, USA, Jun. 15-19, 2014. 4 pages.
Y. Uemoto, M. Hikita, H. Ueno, H. Matsuo, H. Ishida, M. Yanagihara, T. Ueda, T. Tanaka, and D. Ueda, "A normally-off AlGaN/GaN transistor with RonA=2.6mOcm2 and BVds=640V using conductivity modulation," in Proc. IEEE IEDM, San Francisco, CA, USA, Dec. 2006, 4 pages.
W. Chen, K.-Y. Wong, W. Huang, and K. J. Chen, "High-Performance AlGaN/GaN Lateral Field-Effect Rectifiers Compatible with High Electron Mobility Transistors," Appl. Phys. Lett., vol. 92, No. 25, 2008. 4 pages.
E. B. Treidel, et al., "Fast-Switching GaN-Based Lateral Power Schottky Barrier Diodes With Low Onset Voltage and Strong Reverse Blocking," IEEE Electron Device Letters, vol. 33, No. 3, Mar. 2012. 3 pages.
K.-Y. Wong, W. Chen, and K. J. Chen, "Integrated Voltage Reference and Comparator Circuits for GaN Smart Power Chip Technology" ISPSD, 2009. 4 pages.
International Search Report for PCT Application No. PCT/CN2017/082833, dated Aug. 4, 2017, 4 pages.
W. Chen, K.-Y. Wong, and K. J. Chen, "Single-chip boost converter using monolithically integrated AlGaN/GaN lateral field-effect rectifier and normally off HEMT," IEEE Electron Device Lett., vol. 30, No. 5, pp. 430-432, May 2009.
S. Ujita et al., "A compact GaN-based DC-DC converter IC with high speed gate drivers enabling high efficiencies," in Proc. IEEE Int. Symp. Power Semiconductor Devices & ICs, Jun. 2014, pp. 51-54.
R. Wang, Y. Cai, C.-W. Tang, K. M. Lau, and K. J. Chen, "Enhancement-mode Si3N4/AlGaN/GaN MISHFETs," IEEE Electron Device Lett., vol. 27, No. 10, pp. 793-795, Oct. 2006.
V. Kumar, A. Kuliev, T. Tanaka, Y. Otoki, and I. Adesida, "High transconductance enhancement-mode AlGaN/GaN HEMTs on SiC substrate," Electron. Lett., vol. 39, No. 24, Nov. 2003, 2 pages.
Y. Zhang, et al., "Very High Frequency PWM Buck Converters Using Monolithic GaN Half-Bridge Power Stages With Integrated Gate Drivers," IEEE Transactions on Power Electronics, vol. 31, No. 11, Nov. 2016, 17 pages.
S. Monch, et al., "Quasi-normally-off GaN gate driver for high slew-rate D-mode GaN-on-Si HEMTs," in Proc. IEEE Int. Symp. Power Semiconductor Devices & ICs, 2015, 4 pages.
J. Roberts, et al., "Drive and Protection Methods for Very High Current Lateral GaN Power Transistors," in Proc. Annu. IEEE Appl. Power Electron. Conf. Expo., 2015, 4 pages.
N. Ericson, et al., "A 4H Silicon Carbide Gate Buffer for Integrated Power Systems," IEEE Transactions on Power Electronics, vol. 29, No. 2, Feb. 2014, 4 pages.
T. Morita, et al., "GaN Gate Injection Transistor with integrated Si Schottky barrier diode for highly efficient DC-DC converters," in Proc. IEEE IEDM, 2012, 4 pages.

\* cited by examiner

POWER DEVICE WITH INTEGRATED GATE DRIVER

CROSS REFERENCE TO RELATED APPLICATION

This application is a U.S. National Stage filing under 35 U.S.C. § 371 of international patent cooperation treaty (PCT) application No. (PCT)/CN2017/082833, filed May 3, 2017, and entitled "POWER DEVICE WITH INTEGRATED GATE DRIVER", which claims priority to U.S. Provisional Patent Application number 62/391,554, filed on May 4, 2016, entitled: "GaN POWER DEVICE WITH INTEGRATED GATE DRIVER," the entireties of which application are hereby incorporated herein by reference.

TECHNICAL FIELD

This disclosure generally relates to power semiconductor devices, including a gate driver integrated with a power device.

BACKGROUND

Gallium nitride (GaN)-based semiconductor devices are generally known for having high breakdown voltage, high switching speed and low on-resistance characteristics. For example, GaN-based lateral heterojunction (e.g. AlGaN/GaN) devices have shown promise as the core power switching devices in high-performance power conversion systems.

While discrete GaN power devices have already shown better performance than conventional silicon power devices, the peripheral control/driving modules are mainly implemented with a separate silicon-based integrated circuit (IC), leading to a Si-driver/GaN-switch hybrid driving solution. With such a hybrid solution, the inter-chip bonding wires or interconnects on a printed circuit board would present significant parasitic inductances/capacitances, which tend to degrade the circuit performance under high-frequency switching operations.

A two-stage gate driver integrated with a GaN power device has been realized previously. However, the circuit topology of this device has a number of adverse issues, including that the source current drops quickly with increased output voltage, as a result of the reduced gate-to-source voltage of one of the enhancement-mode transistors in the buffer stage when the load is being charged up; the charging process severely slows down when the source current becomes very small as the gate-to-source voltage approaches the device's threshold voltage. Another issue with this circuit is that the amplitude of the output voltage is smaller than the supply voltage, raising the possibility that power devices driven with this circuit cannot be fully turned on. The problem is even more severe when the gate driver is integrated with a power device with a larger threshold voltage. Using a larger supply voltage in the gate driver circuit may alleviate this problem, but would result in a larger gate voltage stress on some of the gate driver's inverter transistors and the corresponding larger power consumption in the driver circuit.

SUMMARY

This Summary is provided to introduce a selection of representative concepts in a simplified form that are further described below in the Detailed Description. This Summary is not intended to identify key features or essential features of the claimed subject matter, nor is it intended to be used in any way that would limit the scope of the claimed subject matter.

Briefly, one or more aspects of the technology described herein are directed towards an integrated circuit comprising a bootstrap circuit comprising a capacitor and a diode, a first inverter circuit coupled to a control signal input terminal, a second inverter circuit coupled to the first inverter circuit, a push-pull circuit comprising a pull-up transistor and a pull-down transistor and a power device comprising a power device transistor with a gate. In response to the control signal input terminal controlling the first inverter to a first output state, the pull-down transistor turns on, to discharge the gate of the power device, turn off the power device and charge the capacitor through the diode. In response to the control signal input terminal controlling the first inverter to a second output state, the pull-down transistor turns off and the pull-up transistor turns on via the capacitor to turn on the power device.

Other advantages may become apparent from the following detailed description when taken in conjunction with the drawings.

BRIEF DESCRIPTION OF THE DRAWINGS

The technology described herein is illustrated by way of example and not limited in the accompanying figures in which like reference numerals indicate similar elements and in which.

DETAILED DESCRIPTION

Figure 1:
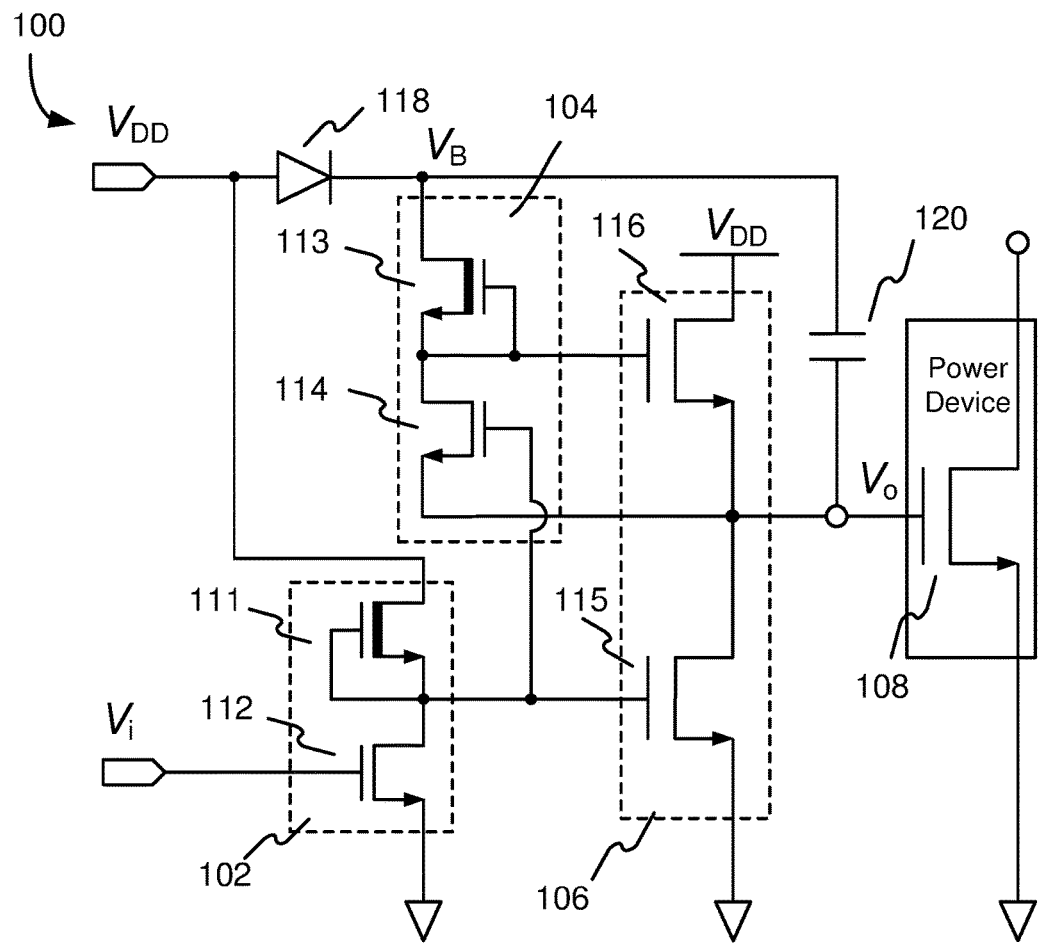
FIG. 1 is an example block diagram representation of a gate driver circuit comprising a bootstrap capacitor and diode integrated with a power device, according to one or more example implementations.

Various aspects of the technology described herein are generally directed towards a bootstrap circuit that may be integrated with a power device. For example, the integration of the circuit for driving a gallium nitride (GaN) power device effectively reduces parasitic parameters, while also increasing the charging speed relative to other gate drivers. Further, the amplitude of the output voltage of the self-bootstrap gate driver circuit described herein can reach the supply voltage rail, providing rail-to-rail driving signal.

As will be understood, one example usage of such a circuit includes a DC/DC converter. The circuit may be used in power conversion systems with high switching frequencies (up to a few hundreds of megahertz), and for example may be used in switch-mode power supplies, UPS (uninterrupted power supplies), data centers, motor drives and the like.

In one or more implementations, GaN-based power devices with an integrated gate driver are described herein. Such an integrated circuit features enhancement-mode GaN power device that operate with high-voltage blocking capability (e.g. 100~1,000 V between source and drain) and an integrated gate driver circuit that operates under a relatively low supply voltage (e.g. 5 to 10 V). The various components, including transistors, diode, capacitor and/or resistors may be integrated in the gate driver circuit on a GaN-on-Si platform. The GaN-based gate drive circuit, when monolithically integrated with GaN power devices, benefits from significantly reduced parasitic effects and consequently improved switching performance. The gate drive circuit described herein employs a self-bootstrap scheme, providing for the amplitude of the generated drive signal able to reach the supply voltage of the gate driver to achieve rail-to-rail output, enhanced driving capability and fast charging speed relative to other circuits.

It should be understood that any of the examples herein are non-limiting. For example, a number of circuits are shown with field effect transistors, but it is understood that these are only examples. As such, the technology described herein is not limited to any particular implementations, embodiments, aspects, concepts, structures, functionalities or examples described herein. Rather, any of the implementations, embodiments, aspects, concepts, structures, functionalities or examples described herein are non-limiting, and the technology may be used in various ways that provide benefits and advantages in switching concepts in general.

Moreover, the numerous techniques of the present application are described with particular reference example implementations. For simplicity and clarity of illustration, the drawing figures illustrate various general manners of construction, and some descriptions and/or details of well-known features and techniques may be omitted to avoid unnecessarily obscuring the description. Additionally, elements in the drawing figures are not necessarily drawn to scale, some areas or elements may be expanded to help improve understanding. Still further, the terms "first," "second," "third," "fourth," and the like may be used for distinguishing between similar elements and not necessarily for describing a particular sequential or chronological order. It is to be understood that the terms so used are interchangeable. Furthermore, the terms "comprise," "include," "have," and any variations thereof, are intended to cover non-exclusive inclusions, such that a process, method, article, apparatus, or composition that comprises a list of elements is not necessarily limited to those elements, but may include other elements not expressly listed or inherent to such process, method, article, apparatus, or composition.

It is contemplated and intended that the design of the controlling portion in the present application can be applied to other heterostructures such as InAlN/GaN, AlN/GaN, or other semiconductor materials, including a silicon device, a silicon carbide device, a gallium nitride device or a gallium arsenide device; for clarity, the examples are based on an AlGaN/GaN-on-Si platform. However, these are only non-limiting examples, and many variations to modify the design to make other combinations and forms of such designs are generally able to be employed.

In general, and as represented in the example implementation of FIG. 1, a self-bootstrap type integrated gate driver 100 comprises an input (first) inverter stage 102, a logic (second inverter) stage 104 and a push-pull stage 106 generally directed towards charging and discharging a load stage, shown as a power device 108. The power device 108 may be integrated with the gate driver 100 on the same chip. As will be understood, the transistors 111-116, along with a diode 118 and a capacitor 120, provide a gate drive circuit with enhanced driving capability, higher driving speed and rail-to-rail output.

In FIG. 1, the exemplified input inverter stage 102 comprises a depletion-mode transistor 111 and an enhancement-mode transistor 112, which translate and reshape the input signal $V_i$ for use by the subsequent logic stage 104 and a pull-down transistor 115 of the push-pull stage 106. As can be seen, the source terminals of the transistor 112 and the pull-down transistor 115 are tied together to achieve the same logic '0' reference between the inverter stage 102 and the pull-down transistor 105.

The exemplified logic stage 104 comprises a depletion-mode transistor 113 and an enhancement-mode transistor 114, which form the second inverter that inverts the signal from the input inverter stage 102 to control a pull-up transistor 116 of the push-pull stage 106. The source terminals of the transistor 114 and the pull-up transistor 116 are tied together to achieve the same logic reference between the logic stage (second inverter) 104 and the pull-up transistor 116. Thus, the transistors 115 and 116 form the push-pull stage 106 that charges and discharges the load stage (power device) 108.

In general, the diode 108 and capacitor 109 form a bootstrap circuit to provide power supply for the logic stage (second inverter) 104 and the pull-up transistor 116. More particularly, the operation of the gate driver is shown in FIG. 2 (discharging process) and FIG. 3 (charging process).

Figure 2:
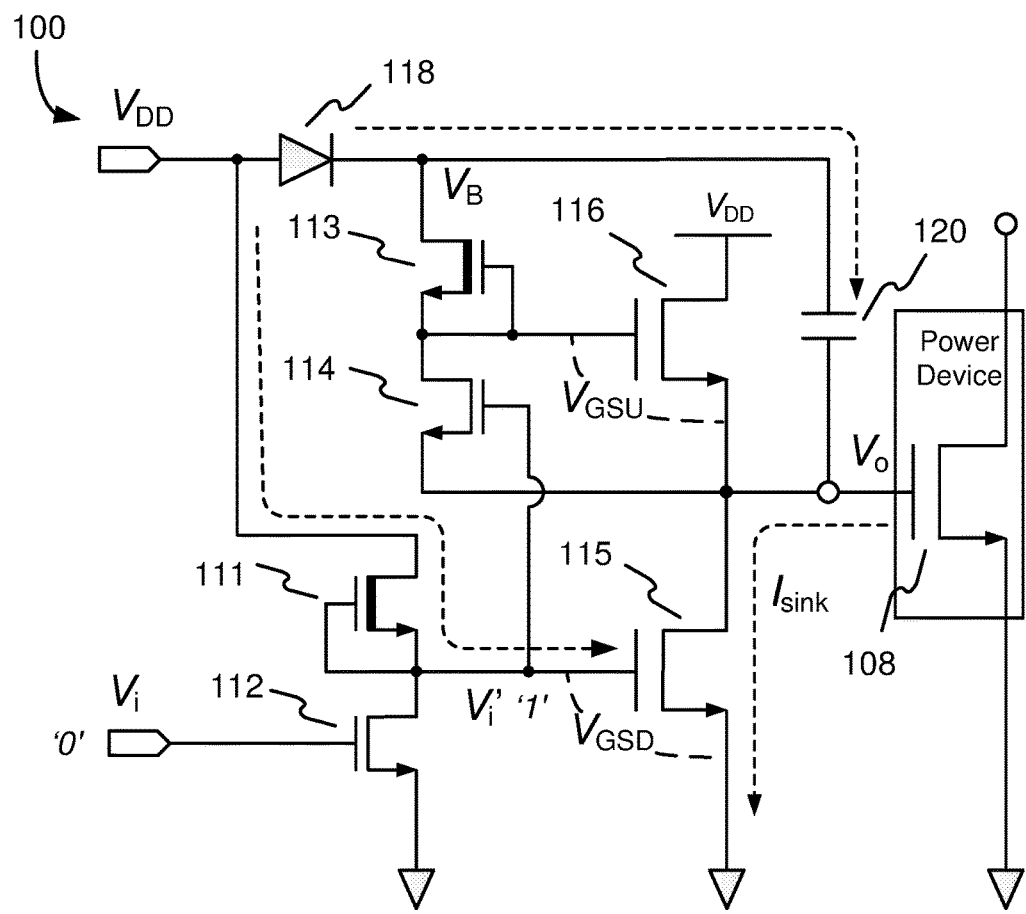
FIG. 2 is an example block diagram representation of the circuit of FIG. 1 showing current flow during a discharging process, according to one or more example implementations.

In the discharging process shown in FIG. 2, when the input signal $V_i$ is at a logic '0' state, the pull-down transistor 115 is fully turned on by the current flow from $V_{DD}$, whereby the power device 108 (its gate) is turned off. In this state, the bootstrap capacitor 120 is charged by the supply voltage $V_{DD}$ through the bootstrap diode 118, until $V_B$ is $V_{DD}$-$V_{DB}$ (where $V_{DB}$ is the turn-on voltage of the bootstrap diode 108). When charged, the capacitor 120 serves as the power supply for the second inverter 104 formed by the transistors 113 and 114.

Figure 3:
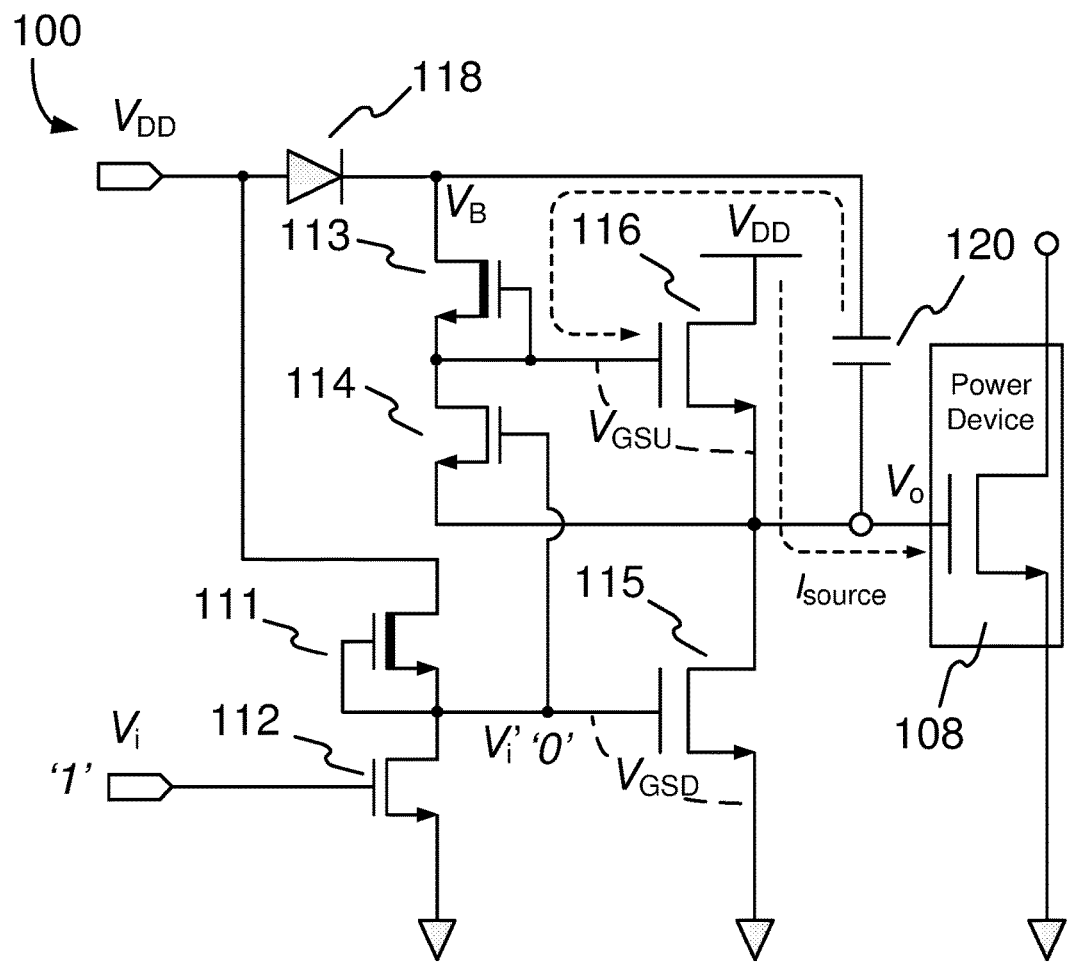
FIG. 3 is an example block diagram representation of the circuit of FIG. 1 showing current flow during a charging process, according to one or more example implementations.

In the charging process shown in FIG. 3, when the input signal $V_i$ is a logic '1' state and $V_i'$ is at a logic '0' state, the pull-down transistor 115 is turned off and the logic stage (second inverter) 104 formed by transistors 113 and 114 outputs a logic '1' state. Note that the voltage levels of logic '0'/'1' for the logic stage (second inverter) 104 are $V_o$/$V_B$, whereas the voltage levels of logic '0'/'1' for the input first) inverter stage 102 are GND/$V_{DD}$.

Because the voltage across the bootstrap capacitor 120 ($V_B$-$V_o$) can be kept near ($V_{DD}$-$V_{DB}$), the gate-to-source voltage VGSU of the pull-up transistor 116 is kept at ($V_{DD}$-$V_{DB}$), whereby in general the pull-up transistor 116 is always on during the charging process and $V_o$ is rapidly charged to $V_{DD}$, achieving rail-to-rail output.

Figure 4A:
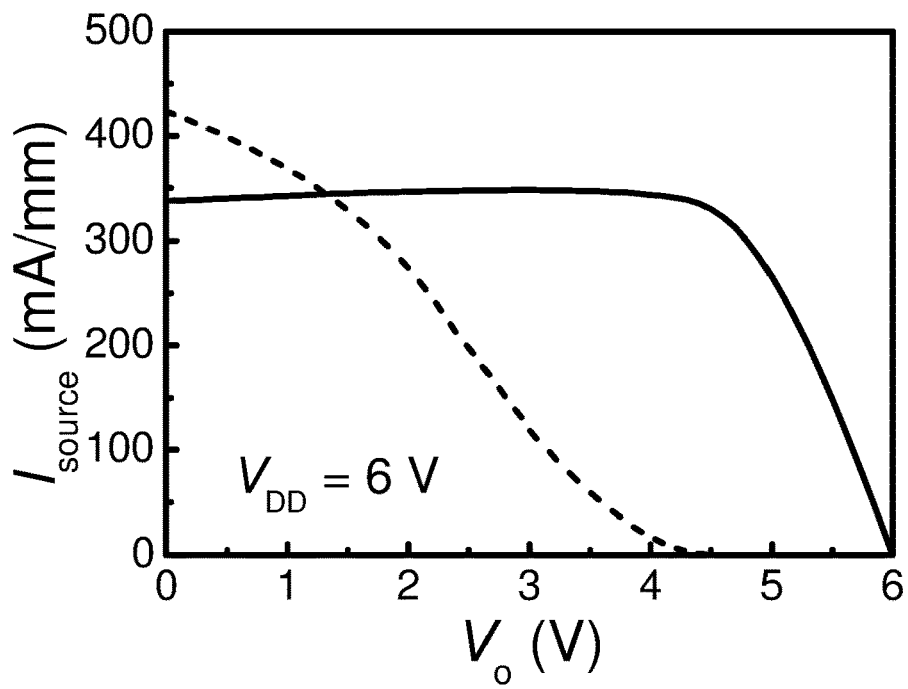
FIG. 4A is a graphical representation that plots relative source currents of a bootstrap gate driver circuit and a non-bootstrap gate driver circuit versus output voltage, according to one or more example implementations.
Figure 4B:
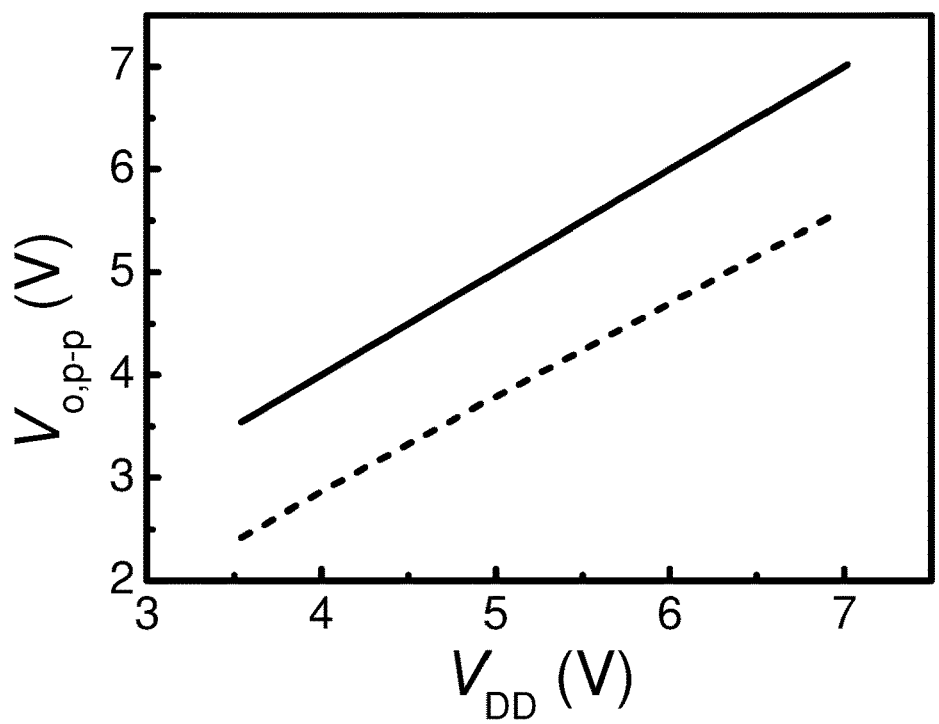
FIG. 4B is a graphical representation that plots relative output voltage amplitudes of a bootstrap gate driver circuit and a non-bootstrap gate driver circuit, according to one or more example implementations.

FIG. 4A is a graphical representation that plots the source current $I_{source}$ of the gate driver 100 (FIGS. 1-3) during circuit operation. As can be seen by the solid line in FIG. 4A, the source current $I_{source}$ of the gate driver is kept at a high level during the charging process, in contrast to the dashed line which drops quickly for a gate driver circuit without the bootstrap technology described herein. Further, the gate driver 100 of FIGS. 1-3 rapidly charges the power device transistor's gate to a voltage of $V_{DD}$; the solid line in FIG. 4B shows the amplitude of gate driver's output voltage under different $V_{DD}$ supply voltages. Indeed, the gate driver 100 of FIGS. 1-3 provides rail-to-rail output as a result of the nearly constant gate-to-source voltage $V_{GSU}$ of the pull-up transistor 116 during the charging process. A gate driver circuit without the bootstrap technology (the dashed line in FIG. 4B) suffers some voltage loss at the output terminal, because the gate-to-source voltage $V_{GSU}$ of a similar pull-up transistor may be larger than its threshold voltage.

Figure 5:
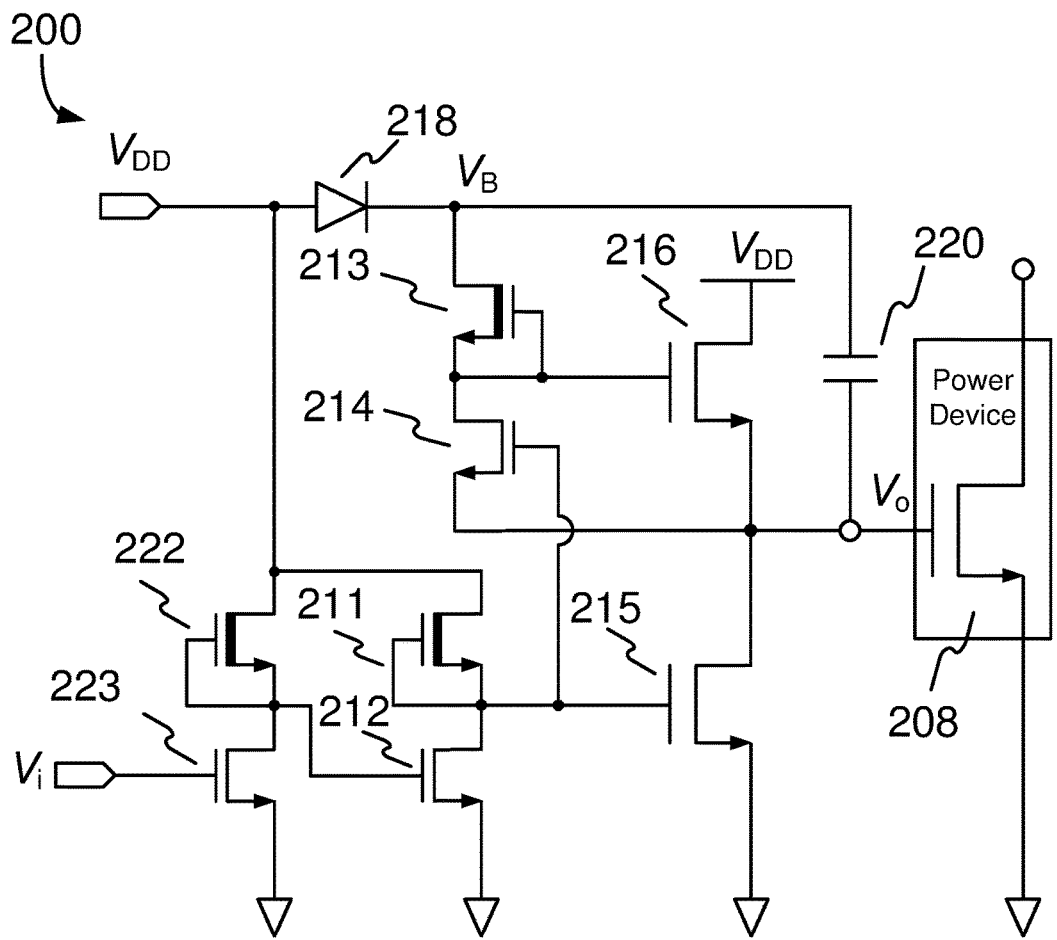
FIG. 5 is an example block diagram representation of an alternative bootstrap gate driver circuit having an additional inverter stage, according to one or more example implementations.

FIG. 5 shows an alternative implementation of a bootstrap gate driver circuit 200, which may be integrated with an (e.g., GaN) power device 208. In the alternative implementation FIG. 5, inverting output is featured. The basic topology of this alternative implementation comprises a first inverter stage with ground as logic '0' formed by transistors 222 and 223, a second inverter stage with a ground terminal as logic '0' formed by transistors 211 and 212, a third inverter stage with $V_o$ as logic '0' formed by transistors 213 and 214, and a push-pull buffer stage formed by transistors 215 and 216. Also shown are the bootstrap components comprising a bootstrap diode 218 and a bootstrap capacitor 220.

Any of the gate driver circuits 100 (FIGS. 1-3), 200 (FIG. 5), 300 (FIG. 6, described below) and 400 (FIG. 7, described below) may use similar underlying technologies. Using the circuit 200 of FIG. 5 as an example, the depletion-mode transistors 211, 213 and 222 may be achieved by Schottky-gated high electron mobility transistors (HEMTs) or metal-insulator-semiconductor HEMTs with gate dielectric between the gate metal and semiconductor. The enhancement-mode transistors 212, 214, 215, 216 and 223 may be achieved by different gate structures, such as p-type gate, fluorine-plasma treated gate or partially/fully recessed gate. The bootstrap diode 218 may be a Schottky barrier diode (SBD), comprising ohmic metal as the cathode and Schottky metal as the anode. Alternatively, the diode 218 may be achieved by a lateral field effect rectifier (L-FER), comprising an enhancement-mode device with its gate and source tied together as the anode, and the drain terminal as the cathode. The turn-on voltage of the bootstrap diode 218 $V_{DB}$ needs to be such that $V_B$-$V_o$ (=$V_{DD}$-$V_{DB}$) is sufficient to act as the power supply of the inverter formed by the transistors 213 and 214 and pull-up transistor 216.

The bootstrap capacitor 220 may be achieved by a metal-insulator-metal (MIM) capacitor, a p-type gate capacitor or a metal-insulator-semiconductor (MIS) capacitor. Further, the MIM capacitor, p-type gate capacitor and MIS capacitor could be paralleled together to achieve a larger capacitance density. Similar to FIGS. 1-3, the capacitor 220 is charged when the pull-down transistor 215 is turned on and $V_o$ is low. The capacitance value needs to store sufficient charge to turn on the pull-up transistor 216 when the $V_i$ input terminal is at the logic low state and the pull-down transistor 215 is turned off.

Figure 6:
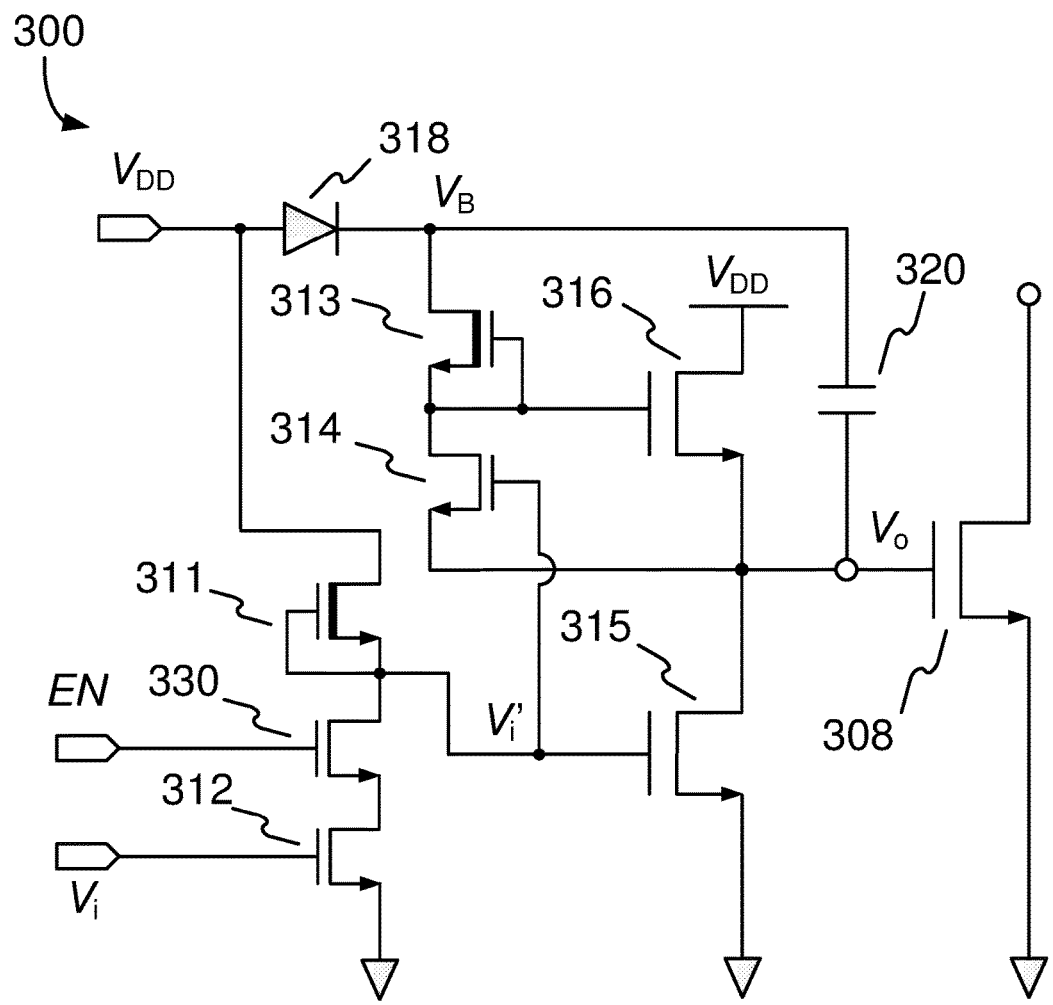
FIG. 6 is an example block diagram representation of an alternative bootstrap gate driver circuit having enable logic, according to one or more example implementations.

FIG. 6 shows another alternative implementation of a bootstrap gate driver circuit 300 including an enable terminal EN, which provides a non-inverting output with an enable function. The basic topology of the circuit 300 comprises a NAND logic gate stage with ground terminal as logic '0' formed by transistors 311, 312 and 330, an inverter stage with $V_o$ as logic '0' formed by transistors 313 and 314, a push-pull buffer stage formed by transistors 315 and 316. The bootstrap circuit comprises a bootstrap diode 318 and a bootstrap capacitor 320. As can be seen from the logic, only when the enable terminal EN is at the logic high state is the enhancement-mode transistor 330 turned on; in this state, the gate driver may drive the power device 308, such as to with a pulse width modulation signal or the like received at the input terminal $V_i$.

Figure 7:
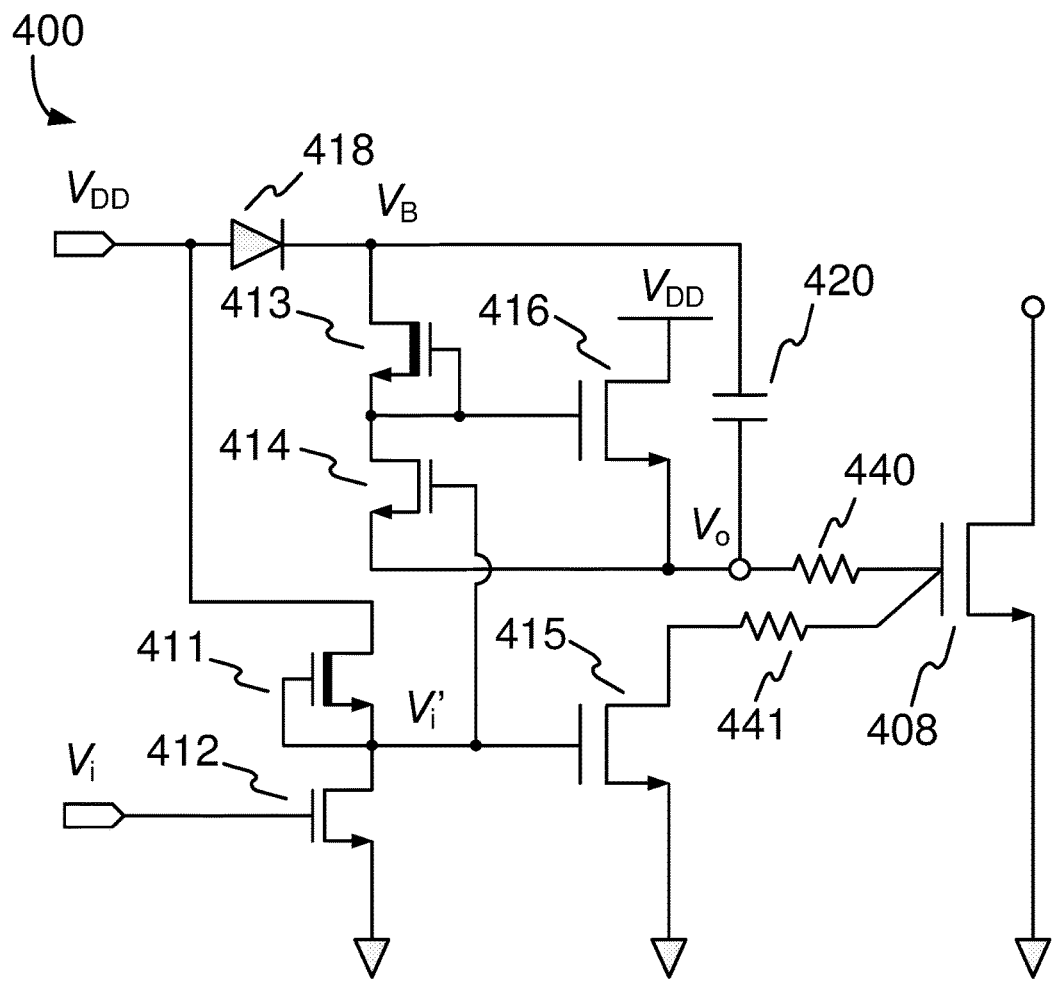
FIG. 7 is an example block diagram representation of an alternative bootstrap gate driver circuit having separate charging and discharging gate loops, according to one or more example implementations.

FIG. 7 shows another alternative implementation of a bootstrap gate driver circuit 300 that may be integrated with an (e.g., GaN) power device 408. FIG. 7 shows a non-inverting output with separate charging and discharging loops at the gate driver's output terminal $V_o$. The basic topology of FIG. 7 comprises a first inverter stage with ground terminal as logic '0' formed by transistor 411 and 412, a second inverter stage with $V_o$ as logic '0' formed by transistors 413 and 414, a push-pull buffer stage formed by transistors 415 and 416. The bootstrap components comprise a bootstrap diode 418 and a bootstrap capacitor 420. A resistor 440 is in the charging loop and a resistor 411 is in the discharging loop. The resistors 410 and 411 may be achieved by 2-DEG (2-dimensional electron gas) channel resistor that is intrinsically formed at the AlGaN/GaN interface.

Figure 8A:
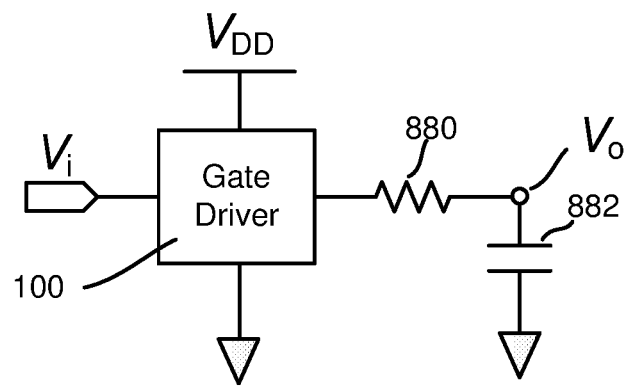
FIG. 8A is a block diagram representation of an example setup for evaluating driving capability of the bootstrap gate driver circuit, according to one or more example implementations.
Figure 8B:
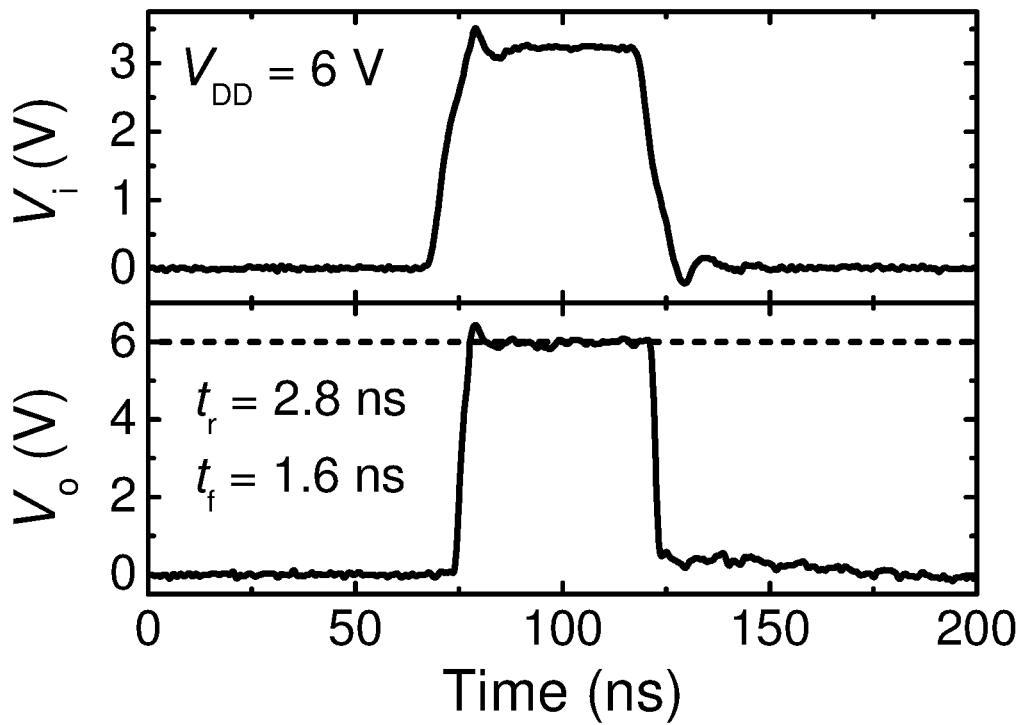
FIG. 8B is a graphical representation demonstrating the driving capability of the circuit of FIGS. 1-3 when used with the example setup of FIG. 8A, according to one or more example implementations.

FIG. 8A shows a measurement setup to exemplify the driving capability of one gate driver circuit with a bootstrap scheme, e.g., the gate driver circuit 100 FIG. 1. The resistor 880 is ten ohms and the capacitor load 882 is 200 pF. FIG. 8B shows the rise time $t_r$ (2.8 nanoseconds) and the fall time $t_f$ (1.6 nanoseconds) for an output drive waveform. As can be seen, the gate driver 100 provides higher driving capability, faster turn-on process and rail-to-rail output; (by way of comparison, a similar circuit without the bootstrap scheme has a significantly larger rise time $t_r$ of 8.8 nanoseconds, a fall time $t_f$ of 1.6 nanoseconds and an output signal with only 4.5-volt amplitude when the power supply is 6.0 volt).

Figure 9A:
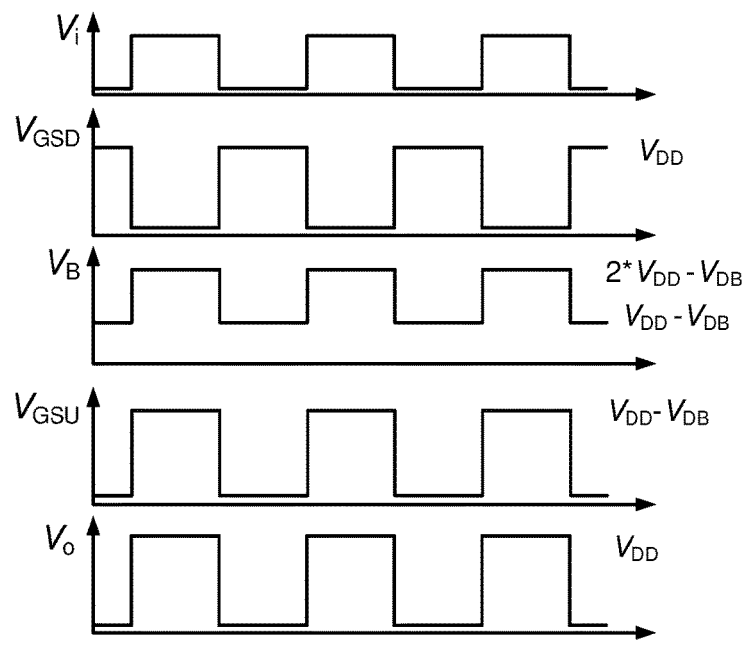
FIG. 9A is an example representation of schematic waveforms of the bootstrap gate driver circuit, according to one or more example implementations.

FIG. 9A shows schematic waveforms of the gate driver circuit 100 (FIG. 1), in which the discharging process corresponds to $V_i$='0', and the charging process corresponds to $V_i$='1'. As can be seen, during the discharging process, the output of the gate driver is 0 V and the voltage drop ($V_B$-$V_o$) across the bootstrap capacitor 120 may be charged to ($V_{DD}$-$V_{DB}$); During the charging process, the gate-to-source voltage $V_{GSU}$ of pull-up transistor 116 can be kept near ($V_{DD}$-$V_{DB}$) as a result of the stable voltage drop across the bootstrap capacitor, whereby the amplitude of $V_o$ can reach up to $V_{DD}$.

Figure 9B:
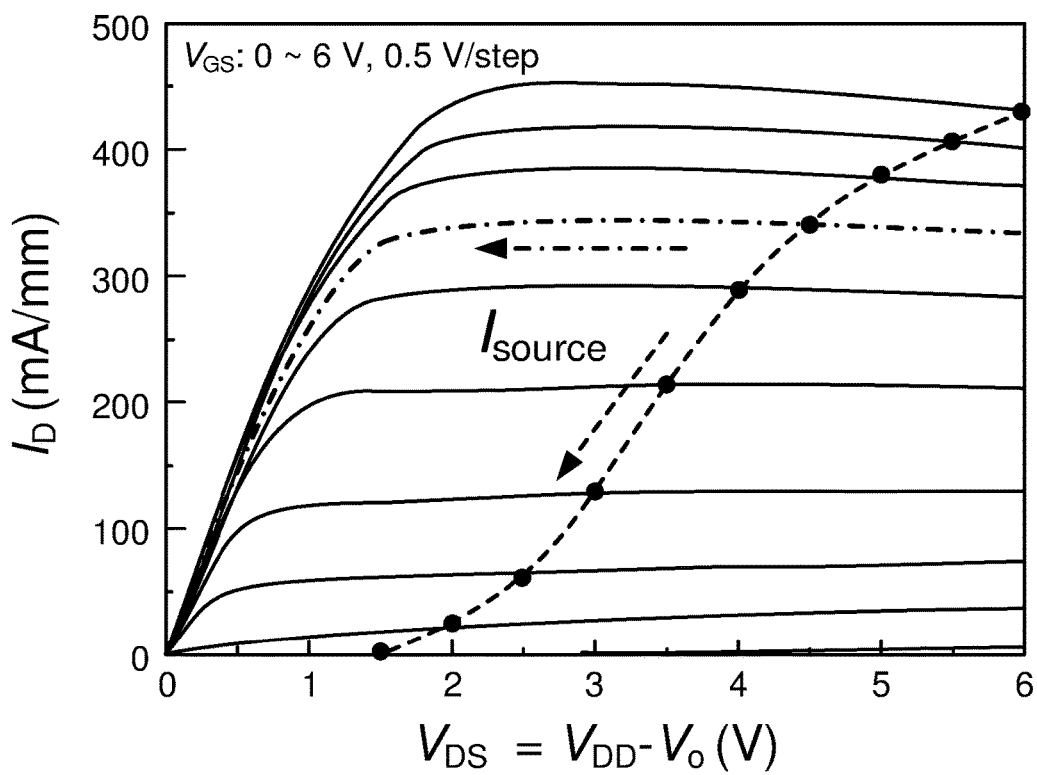
FIG. 9B is a graphical representation of the current versus voltage for a bootstrap gate driver circuit relative to a non-bootstrap gate driver circuit, according to one or more example implementations.

FIG. 9B shows a source current $I_{source}$ comparison of the circuit 100 of FIGS. 1-3 (the dashed, dotted line) versus a non-bootstrap driver circuit (the dashed line) plotted with the I-V curves (the solid line) of the pull-up transistor 116. As can be seen, for the circuit 100 with a bootstrap scheme, the source current $I_{source}$ remains at a high level during the charging process, in contrast to the rapid drop of other schemes. The bootstrap gate driver design is able to charge the power device's gate to voltage of $V_{DD}$.

Figure 10:
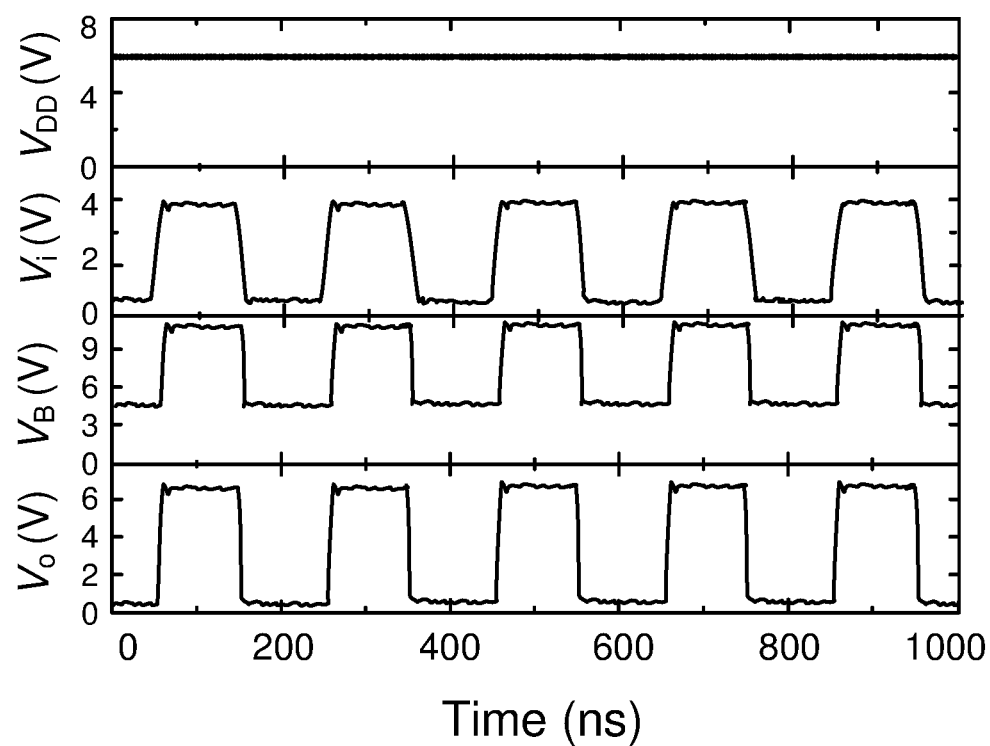
FIG. 10 is a graphical representation of measured voltage waveforms with a five-megahertz pulse width modulated input signal to the circuit of FIGS. 1-3, according to one or more example implementations.

Turning to high frequency operation, FIG. 10 shows the measured voltage waveforms of the implementation of FIGS. 1-3 when the input pulse width modulation is five megahertz and $V_{DD}$ is 6.0 volts. The voltage drop across the bootstrap capacitor 120 is approximately 4.5 volts for the turn-on voltage of bootstrap diode 118 is approximately 1.5 volts. The voltage $V_B$ may be elevated to approximately 10.5 volts when $V_o$ is charged up to 6.0 volts.

Figure 11A:
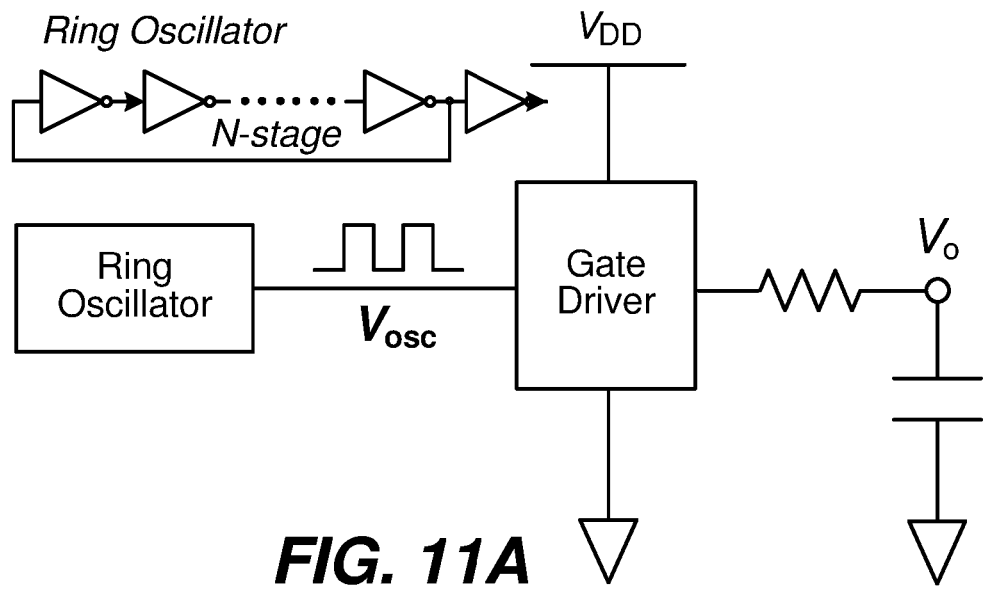
FIG. 11A is a block diagram representation of an example setup for inputting a 25-megahertz input signal to the circuit of FIGS. 1-3, according to one or more example implementations.
Figure 11B:
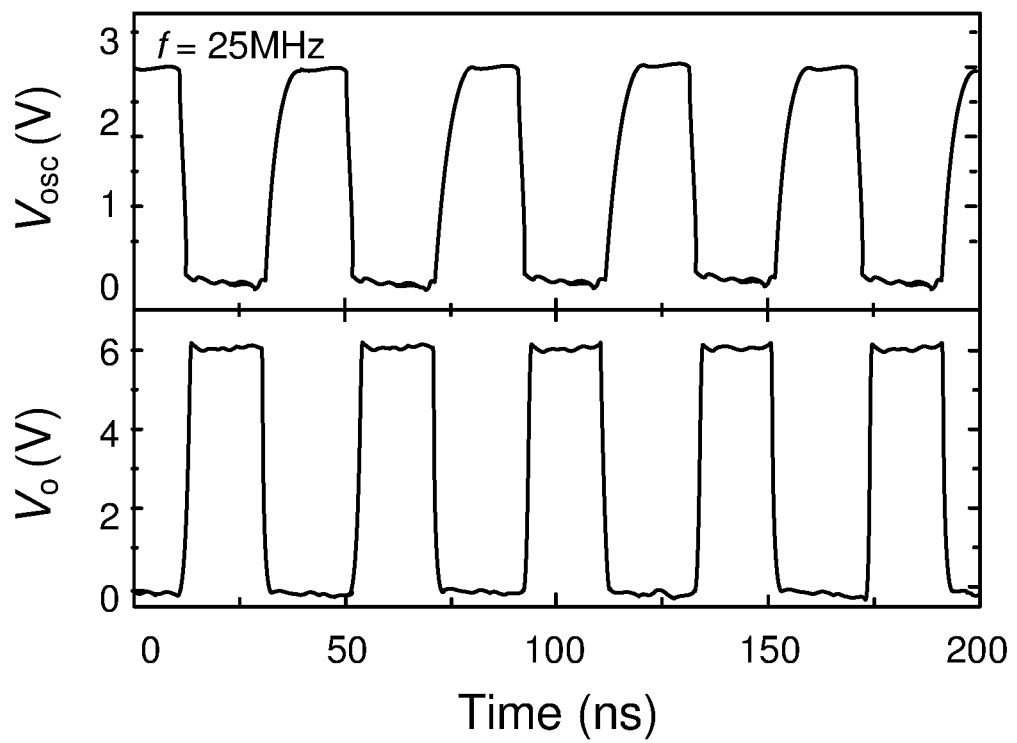
FIG. 11B shows measured voltage waveforms with the example setup of FIG. 11A, according to one or more example implementations.

FIGS. 11A and 11B demonstrate that the gate driver circuit 100 with the bootstrap scheme works properly under a 25-MHz high frequency input pulse width modulation signal generated by a ring oscillator.

Figure 12:
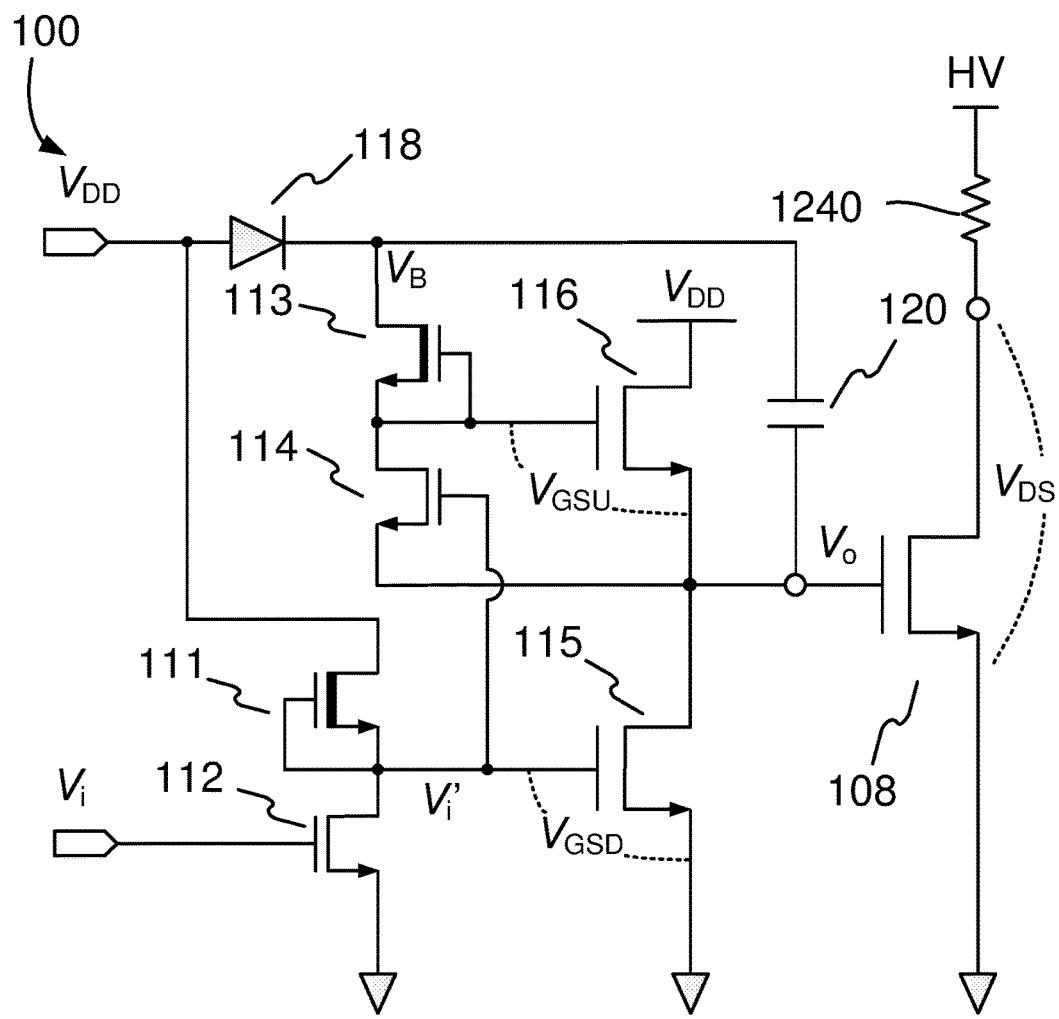
FIG. 12 is a block diagram representation of an example bootstrap gate driver circuit with resistive-load switching, according to one or more example implementations.
Figure 13:
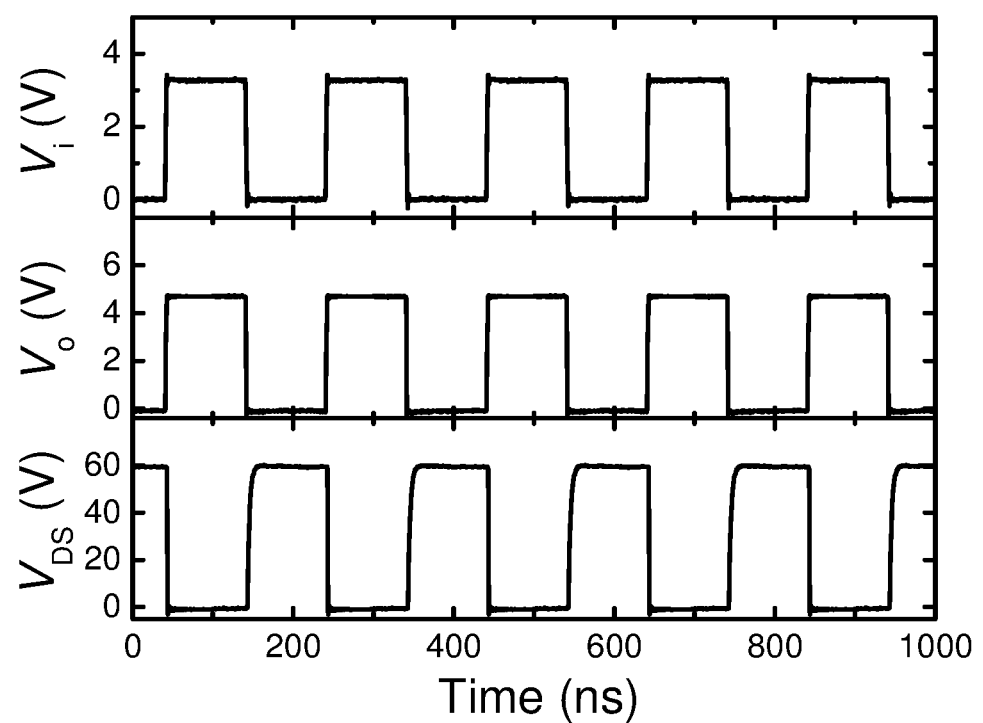
FIG. 13 is a representation of the switching waveforms of the bootstrap gate driver circuit with resistive-load switching of FIG. 12, according to one or more example implementations.

FIG. 12 shows resistive-load switching, with a load 1240 in the form of an external twenty-ohm resistor. The voltage HV is sixty volts in this example. FIG. 13 shows the voltage waveforms during one test with a switching frequency of five megahertz.

As can be seen, there is provided a gate driver circuit with a self-bootstrap technology comprising a diode and capacitor. The gate driver circuit has low parasitic inductance, high operation frequency, a convenient control method and high compatibility between peripheral circuits and power devices. Indeed, the gate driver circuit operates appropriately at high frequencies on the order of (at least) 5 to 25 MHz, and operates appropriately under resistive load. The gate driver circuit may be integrated with a power device, e.g., fabricated on the same chip, without the need of a hybrid driving solution.

One or more aspects are directed towards a gate driver comprising an output terminal coupled to a power device, the gate driver comprising a first transistor comprising a first gate terminal electrically in contact with a first source terminal, and a first drain terminal electrically in contact with a power supply, and a second transistor comprising a second gate terminal electrically coupled to an input terminal, a second drain terminal electrically in contact with the first source terminal of the first transistor, and a second source terminal electrically in contact with ground. Further aspects comprise a third transistor comprising a third gate terminal electrically in contact with a third source terminal, and a third drain terminal, a diode comprising an anode electrically in contact with the power supply and a cathode electrically in contact with the third drain terminal of the third transistor, and a fourth transistor comprising a fourth gate terminal electrically in contact with the second drain terminal of the second transistor, a fourth drain terminal electrically in contact with the third source terminal of the third transistor, and a fourth source terminal electrically in contact with the output terminal. Further aspects comprise a fifth transistor comprising a fifth gate terminal electrically in contact with the second drain terminal of the second transistor, a fifth drain terminal electrically coupled to the output terminal, and a fifth source terminal electrically in contact with ground, a sixth transistor comprising a sixth gate terminal electrically in contact with the fourth drain terminal of the fourth transistor, a sixth drain terminal electrically in contact with the power supply, and a sixth source terminal electrically in contact with the output terminal, and a capacitor electrically connected between the cathode of the diode and the output terminal.

The power device may comprise a power device transistor comprising a power device transistor gate terminal electrically connected to the output terminal, a power device transistor drain terminal electrically coupled to a high voltage node, and a power device transistor source terminal electrically in contact with ground. The power device transistor drain terminal may be electrically coupled to the high voltage node via a load.

The second gate terminal electrically coupled to the input terminal may be electrically in contact with the input terminal. The fifth drain terminal electrically coupled to the output terminal may be electrically in contact with the output terminal.

The first transistor may comprise a first depletion-mode transistor and the third transistor may comprise a second depletion-mode transistor. The second transistor may comprise a first enhancement-mode transistor, the fourth transistor may comprise a second enhancement-mode transistor, the fifth transistor may comprise a third enhancement-mode transistor and the sixth transistor may comprise a fourth enhancement-mode transistor.

Aspects may comprise an inverter stage comprising seventh and eighth transistors. The seventh transistor may comprise a seventh gate terminal electrically in contact with a seventh source terminal, and a seventh drain terminal electrically in contact with the power supply. The eighth transistor may comprise an eighth gate terminal electrically in contact with the input terminal, the drain terminal of the eighth transistor electrically in contact with the seventh source terminal of the seventh transistor, and an eighth source terminal electrically in contact with ground. The second gate terminal of the second transistor may be electrically coupled to the input terminal by being electrically in contact with the seventh drain terminal of the seventh transistor.

Other aspects may comprise a seventh transistor comprising a seventh drain terminal electrically in contact with the first source terminal of the first transistor, a seventh gate terminal electrically in contact with an enable terminal, and a seventh source terminal electrically in contact with the second drain terminal of the second transistor.

Still other aspects may comprise a first resistor connected between the output terminal and the power device and a second resistor connected between the drain terminal of the fifth transistor and the power device. The fifth drain terminal may be electrically coupled to the output terminal via the second resistor and the first resistor.

At least one of the first, second, third, fourth, fifth or sixth transistors may comprise a silicon device, a silicon carbide device, a gallium nitride device or a gallium arsenide device.

One or more aspects are directed towards an integrated circuit comprising a bootstrap circuit comprising a capacitor and diode, a first inverter circuit coupled to a control signal input terminal, a second inverter circuit coupled to the first inverter circuit, a push-pull circuit comprising a pull-up transistor and a pull-down transistor and a power device comprising a power device transistor with a gate. In response to the control signal input terminal controlling the first inverter to a first output state, the pull-down transistor turns on to discharge the gate of the power device transistor, turn off the power device and charge the capacitor through the diode. In response to the control signal input terminal controlling the first inverter to a second output state, the pull-down transistor turns off and the pull-up transistor turns on via the capacitor to turn on the power device.

The first inverter circuit, the second inverter circuit, the push-pull circuit and the power device may comprise respective gallium nitride devices. Aspects may comprise at least one resistor, wherein, in response to the pull-down transistor being turned on, the gate of the power device transistor is discharged through the at least one resistor.

The first inverter circuit further may comprise an enable transistor coupled to an enable signal input terminal, the enable signal input terminal configured to be controlled to a disabled state that prevents the first inverter from being controlled to the second output state or to be controlled to an enabled state that allows the first inverter to be controlled to the second output state.

One or more aspects are directed towards signaling a first inverter stage with a first control voltage to charge a capacitor through a diode coupled to a power supply, turn off a power device and, in a discharging operation, discharge a transistor gate of the power device through a pull-down transistor. Aspects comprise signaling the first inverter stage with a second control voltage to couple the capacitor to a pull-up transistor gate to turn on a pull-up transistor and, in a charging operation, turn on the power device.

The signaling of the first inverter stage with the first control voltage and the signaling of the first inverter stage with a second control voltage may comprise driving the first inverter stage with a high frequency on and off signal. Other aspects may comprise controlling an enable signal state to a first state that disables the signaling of the first inverter stage with the second control voltage, or to a second state that enables the signaling of the first inverter stage with the second control voltage.

CONCLUSION

While the invention is susceptible to various modifications and alternative constructions, certain illustrated implementations thereof are shown in the drawings and have been described above in detail. It should be understood, however, that there is no intention to limit the invention to the specific forms disclosed, but on the contrary, the intention is to cover all modifications, alternative constructions, and equivalents falling within the spirit and scope of the invention.

In addition to the various implementations described herein, it is to be understood that other similar implementations can be used or modifications and additions can be made to the described implementation(s) for performing the same or equivalent function of the corresponding implementation(s) without deviating therefrom. Accordingly, the invention is not to be limited to any single implementation, but rather is to be construed in breadth, spirit and scope in accordance with the appended claims.

What is claimed is:

1. A system, comprising:
a gate driver comprising an output terminal coupled to a power device, the gate driver comprising:
a first transistor comprising a first gate terminal electrically in contact with a first source terminal, and a first drain terminal electrically in contact with a power supply;
a second transistor comprising a second gate terminal electrically coupled to an input terminal, a second drain terminal electrically in contact with the first source terminal of the first transistor, and a second source terminal electrically in contact with ground;
a third transistor comprising a third gate terminal electrically in contact with a third source terminal, and a third drain terminal;
a diode comprising an anode electrically in contact with the power supply and a cathode electrically in contact with the third drain terminal of the third transistor;
a fourth transistor comprising a fourth gate terminal electrically in contact with the second drain terminal of the second transistor, a fourth drain terminal electrically in contact with the third source terminal of the third transistor, and a fourth source terminal electrically in contact with the output terminal;
a fifth transistor comprising a fifth gate terminal electrically in contact with the second drain terminal of the second transistor, a fifth drain terminal electrically coupled to the output terminal, and a fifth source terminal electrically in contact with ground;
a sixth transistor comprising a sixth gate terminal electrically in contact with the fourth drain terminal of the fourth transistor, a sixth drain terminal electrically in contact with the power supply, and a sixth source terminal electrically in contact with the output terminal; and
a capacitor electrically connected between the cathode of the diode and the output terminal.

2. The system of claim 1, wherein the power device comprises a power device transistor comprising a power device transistor gate terminal electrically connected to the output terminal, a power device transistor drain terminal electrically coupled to a high voltage node, and a power device transistor source terminal electrically in contact with ground.

3. The system of claim 1, wherein the power device transistor drain terminal is electrically coupled to the high voltage node via a load.

4. The system of claim 1, wherein the second gate terminal electrically coupled to the input terminal is electrically in contact with the input terminal.

5. The system of claim 1, wherein the fifth drain terminal electrically coupled to the output terminal is electrically in contact with the output terminal.

6. The system of claim 1, wherein the first transistor comprises a first depletion-mode transistor and the third transistor comprises a second depletion-mode transistor.

7. The system of claim 1, wherein the second transistor comprises a first enhancement-mode transistor, the fourth transistor comprises a second enhancement-mode transistor, the fifth transistor comprises a third enhancement-mode transistor and the sixth transistor comprises a fourth enhancement-mode transistor.

8. The system of claim 1, further comprising an inverter stage comprising seventh and eighth transistors, the seventh transistor comprising a seventh gate terminal electrically in contact with a seventh source terminal, and a seventh drain terminal electrically in contact with the power supply, and the eighth transistor comprising an eighth gate terminal electrically in contact with the input terminal, the drain terminal of the eighth transistor electrically in contact with the seventh source terminal of the seventh transistor, and an eighth source terminal electrically in contact with ground.

9. The system of claim 8, wherein the second gate terminal of the second transistor is electrically coupled to the input terminal by being electrically in contact with the seventh drain terminal of the seventh transistor.

10. The system of claim 1, further comprising a seventh transistor comprising a seventh drain terminal electrically in contact with the first source terminal of the first transistor, a seventh gate terminal electrically in contact with an enable terminal, and a seventh source terminal electrically in contact with the second drain terminal of the second transistor.

11. The system of claim 1, further comprising a first resistor connected between the output terminal and the power device and a second resistor connected between the drain terminal of the fifth transistor and the power device.

12. The system of claim 11, wherein the fifth drain terminal is electrically coupled to the output terminal via the second resistor and the first resistor.

13. The system of claim 1, wherein at least one of the first, second, third, fourth, fifth or sixth transistors comprises a silicon device, a silicon carbide device, a gallium nitride device or a gallium arsenide device.

14. A system, comprising an integrated circuit, the integrated circuit comprising:
a bootstrap circuit comprising a capacitor and diode;
a first inverter circuit coupled to a control signal input terminal;
a second inverter circuit coupled to the first inverter circuit;
a push-pull circuit comprising a pull-up transistor and a pull-down transistor;
a power device comprising a power device transistor with a gate;
wherein, in response to the control signal input terminal controlling the first inverter to a first output state, the pull-down transistor turns on to discharge the gate of the power device transistor, turn off the power device and charge the capacitor through the diode, and
wherein, in response to the control signal input terminal controlling the first inverter to a second output state, the pull-down transistor turns off and the pull-up transistor turns on via the capacitor to turn on the power device.

15. The system of claim 14, wherein the first inverter circuit, the second inverter circuit, the push-pull circuit and the power device comprise respective gallium nitride devices.

16. The system of claim 14, further comprising at least one resistor, wherein, in response to the pull-down transistor being turned on, the gate of the power device transistor is discharged through the at least one resistor.

17. The system of claim 14, wherein the first inverter circuit further comprises an enable transistor coupled to an enable signal input terminal, the enable signal input terminal configured to be controlled to a disabled state that prevents the first inverter from being controlled to the second output state or to be controlled to an enabled state that allows the first inverter to be controlled to the second output state.

18. A method, comprising:
signaling a first inverter stage with a first control voltage to charge a capacitor through a diode coupled to a power supply, turn off a power device and, in a discharging operation, discharge a transistor gate of the power device through a pull-down transistor; and
signaling the first inverter stage with a second control voltage to couple the capacitor to a pull-up transistor gate to turn on a pull-up transistor and, in a charging operation, turn on the power device.

19. The method of claim 18, wherein the signaling of the first inverter stage with the first control voltage and the signaling of the first inverter stage with a second control voltage comprises driving the first inverter stage with a high frequency on and off signal.

20. The method of claim 18, further comprising, controlling an enable signal state to a first state that disables the signaling of the first inverter stage with the second control voltage, or to a second state that enables the signaling of the first inverter stage with the second control voltage.

* * * * *